United States Patent [19]

Scott

[11] Patent Number: 4,677,691
[45] Date of Patent: Jun. 30, 1987

[54] MICROWAVE RECEIVER

[75] Inventor: Bentley N. Scott, Richardson, Tex.

[73] Assignee: Texas Instruments Incorporated, Dallas, Tex.

[21] Appl. No.: 761,635

[22] Filed: Aug. 1, 1985

[51] Int. Cl.⁴ .............................................. H04B 1/26
[52] U.S. Cl. .................................... 455/318; 455/332; 455/330; 455/326; 331/117 FE
[58] Field of Search ............... 455/318, 319, 330, 332, 455/333, 325, 326; 331/45, 108 B, 114, 117 R, 117 FE, 135, 117 D; 332/43 B

[56] References Cited

U.S. PATENT DOCUMENTS

| | | | |
|---|---|---|---|
| 3,514,720 | 5/1970 | Roucache et al. | 455/326 |
| 4,479,259 | 10/1984 | Fenk | 455/318 |
| 4,485,355 | 11/1984 | Scott | 331/117 FE |

FOREIGN PATENT DOCUMENTS 1603627 11/1981 United Kingdom ................ 331/45

Primary Examiner—Jin F. Ng
Attorney, Agent, or Firm—Robert O. Groover, III; Carlton H. Hoel; Melvin Sharp

[57] ABSTRACT

A microwave oscillator provides two outputs, of opposite phase, which are directly connected to provide the local oscillator inputs to a balanced mixer. Since no balun is used, very wide-band performance can be obtained.

13 Claims, 6 Drawing Figures

MICROWAVE RECEIVER

BACKGROUND AND SUMMARY OF THE INVENTION

The present invention relates to microwave oscillator and mixer combinations, and particularly to microwave receivers.

Many microwave receiver systems use a balanced or doubly balanced mixer to achieve adequate LO-to-RF isolation. In a balanced mixer, the local oscillator provides two inputs having the same frequency but different phases. A diode ring mixer can then achieve mixing with good isolation.

The conventional balanced mixer uses either a 90 degree or a 180 degree transformer to generate the necessary balanced inputs; at microwave frequencies, this transformer is typically realized by use of hybrid couplers (for a 90 degree transformer) or balun structures (for a 180 degree transformer). In either case, the phase and amplitude of the transformer output do not remain constant over frequency; this frequency dependence causes degradation of harmonic suppression, and also causes the LO-to-RF isolation to be dependent upon diode match.

A 180 degree mixer has good isolation characteristics if the diodes are balanced, regardless of the goodness of the impedance match. Phase errors are multiplied by the order of the LO harmonic, and therefore very large phase errors in conventional schemes can be expected. Typical balun phase errors can easily be 50 to 10 degress over bandwidths of less than an octave.

As the bandwidth of the conventional structure is sought to be increased, the requirements for the layout become more complex and less producible. Suspended substrate and fin-line structures are common methods to achieve the coupling and impedance levels required. These structures are difficult to implement, and, in the case of suspended substrate, mechanical integrity with temperature variation is always a problem.

The present invention is highly advantageous in permitting mixers to be integrated on GaAs (or other III-V substrate). Since monolithic oscillators, low noise amplifiers, and transmit-receive switches have already been implemented on GaAs, the only circuits preventing integration of a complete down conversion front-end is a balun and an active mixer topology. The present invention allows the oscillator and mixer to be directly interfaced, which will eliminate the need for a balun structure and will reduce the chip area required for a mixer/oscillator chip.

Of course, other mixer designs besides a diode ring can be used. For example, a differential pair of MESFETs can be used, or one or more dual-gate FETs, or active-device configurations. These active-device configurations may in fact be more advantageous for integration on a single monolithic substrate.

According to the present invention there is provided: A microwave receiver comprising: a local oscillator comprising first and second field-effect transistors each comprising a gate and first and second source/drain terminals, and a resonant circuit connected between the gates of said first and second field-effect transistors, said gates of said first and second field-effect transistors being located at opposite-phase points of said resonant circuit; a balanced mixer having an rf input and a mixed output and a first local-oscillator input operatively connected to one of said source/drain terminals of said first field-effect transistor and a second local-oscillator input operatively connected to one of said source/drain terminals of said second field-effect transistor; means for providing an rf microwave signal to said balanced mixer; and means for filtering the output of said mixer to remove frequency components corresponding to said rf microwave signal therefrom.

BRIEF DESCRIPTION OF THE DRAWINGS

The present invention will be desribed with reference to the accompanying drawings, wherein.

DESCRIPTION OF THE PREFERRED EMBODIMENTS

The present invention will be described with reference to sample specific preferred embodiments, but it should be recognized by those skilled in the art that the present invention teaches a new concept in microwave circuitry, and also in microwave receivers, and can be very widely modified and varied.

In particular, the present invention is the first to teach a complete workable integrated microwave receiver on a chip. This novel concept has an immense number of advantages, and can also be very widely modified and varied.

Figure 2:
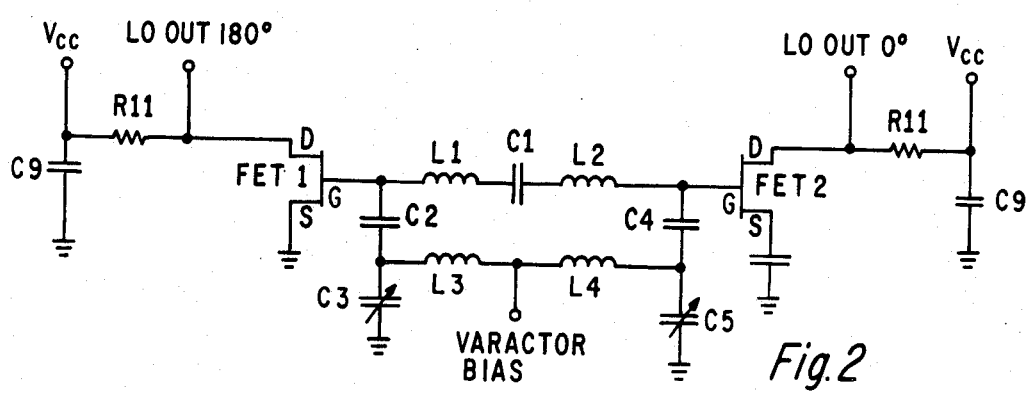
FIG. 2 shows the push-push oscillator portion of the oscillator-mixer combination of the present invention.

FIG. 2 shows a push-push oscillator circuit, wherein the two active devices FET1 and FET2 have outputs (into load 1 and load 2) which are inherently 180 degrees out of phase. The resonance of the gate circuit (incorporating the parasitic capacitance of the gates FET1 and FET2) will determine the resonating point of the gate. Other resonant circuits could be substituted into the gate circuit, but note that the gates of FET1 and FET2 must not be connected to points in the resonant circuit which have common phase. (More precisely, the gates of FET1 and FET2 should be at points in the resonance circuit which are approximately 180 degrees out of phase.) In the circuit shown, the inclusion of inductors L1 and L2 in series between the gates helps assure this condition.

Varactors C3 and C5 are used to tune the gate circuit, although of course other tuning network configurations could be used. Capacitors C1, C2, and C4 are merely low-impedence capacitors used for bias voltage isolation, and chokes L3 and L4 are high-impedance inductors for bias-supply isolation.

As is extensively discussed in U.S. Pat. No. 4,485,355 (TI-8757), which is hereby incorporated by reference, the circuit shown in FIG. 2 provides inherent proper biasing of the gate circuit, due to forward conduction of the Schottky-barrier gate diode in the MESFET's FET1 AND FET2. Thus, in this presently preferred embodiment, no separate gate bias circuitry is needed (although other embodiments of the invention can of course use such bias circuits if desired).

The drain bias circuits are conventional, and simply serve to provide a filtered drain power supply voltage through network R11 and C9.

The proposed structure will provide a very broadband true 180 degree phase difference with uniform amplitude variations and replaces the usual balun on the lo port. The device is an oscillator circuit typically called a push-push oscillator topology where the usually coupled halves are separated and power is removed from these half circuits leaving the impedance loading on each port equal and the phase 180 apart. This allows the actual signal generation, phase difference, and power division to be implemented within the fundamental local oscillator circuit.

In this push-push oscillator the power is removed from the drain of the FET instead of (as is more common) from the gate (or base terminal in the bipolar transistor circuit. ) This circuit lends itself to the removal of the power in this manner since the terminals where the transfer of the push-push action occur remain coupled (source - gate of FET 1 and Gate - source of FET 2) and the drains need only to be loaded into a general impedance value. These type of oscillator circuits have been used over octave bandwidths and the 1st harmonic signal is by definition of the push-push topology, 180 degrees out of phase.

Figure 1:
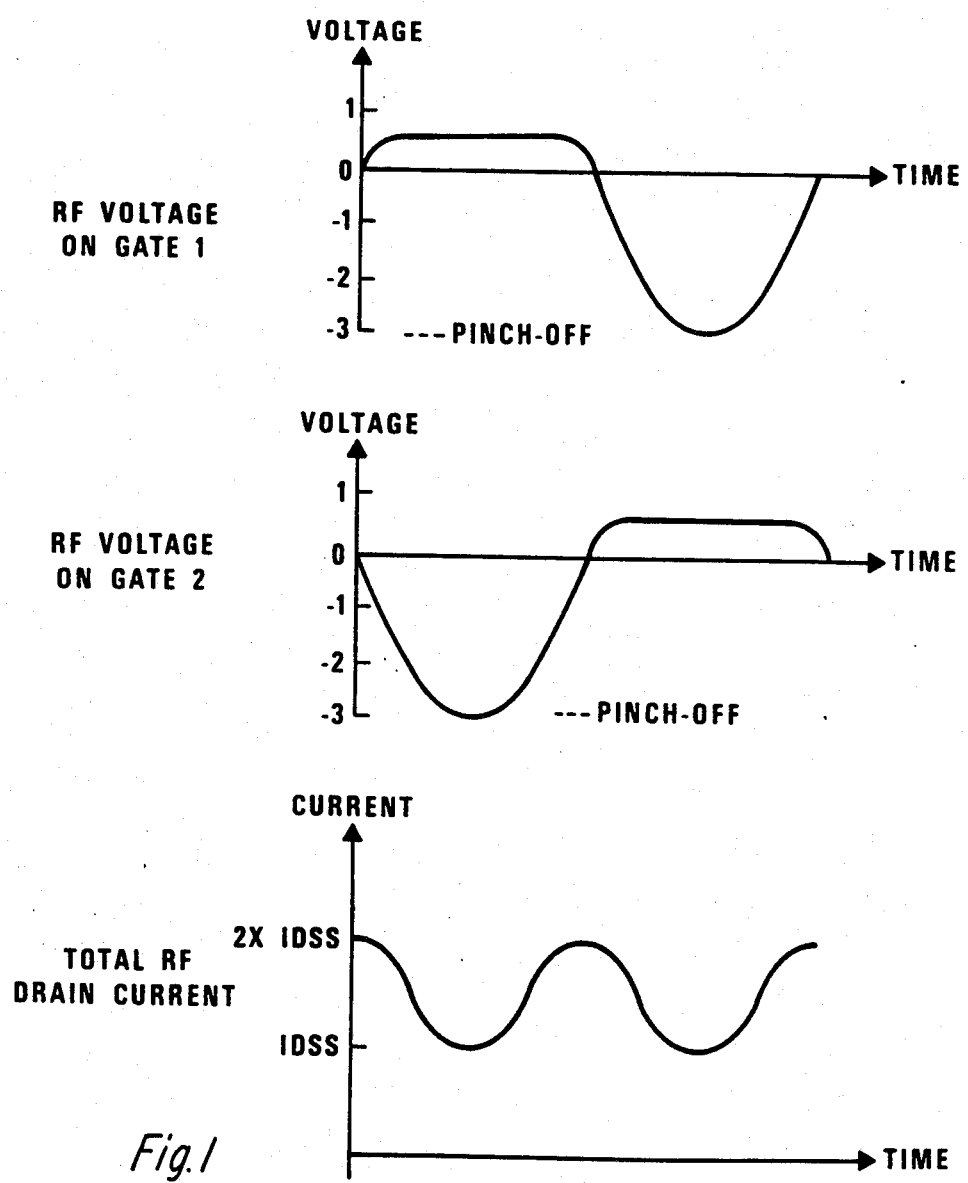
FIG. 1 shows waveforms appearing on the two devices FET1 and FET2 of FIG. 2.

Operation of a push-push oscillator can be explained by FIG. 1 and the following discussion. The RF voltage swing which is of opposite polarity at each gate forward biases one FET's gate-source diode while pinching off the 2nd FET. It then reverses the process as the RF swing reverses polarity. As the gate of FET1 is driven into forward diode conduction (clamping the gate-source voltage at 0.6 volts), FET2 is driven towards pinchoff. Since both gates are operated at zero gate bias (in this example), the RF swing is about the zero voltage reference line. At zero volts on both FET's the drain current is two times the IDSS current of a single FET. As one FET is driven toward pinchoff due to the RF voltage swing, the total drain current drops to the IDSS of one device. This will effectively generate the second harmonic of the fundamental operating frequency of each transistor if the outputs are connected together. This is the typical application of the push-push oscillator. It can be easily seen that if the drains are loaded into separate loads that the phase at the fundamental is 180 degrees out of phase between the two ports, that the power will remain well balanced due to the symmetry, and the output frequency will be at the fundamental.

The asymmetrical sine wave generated in this configuration may also have the further advantage of enhancing mixer performance.

Power can be taken out of the source or drain network, although the drain network is less sensitive to reactive loading than is the source.

This topology will be of particular importance in receivers for new defence suppression products or in consumer products like the direct broadcast receiver systems. It will reduce the complexity and improve the reproducibility of these systems and will allow integration of the system in GaAs monolithic microwave integrated circuit form.

Figure 6:
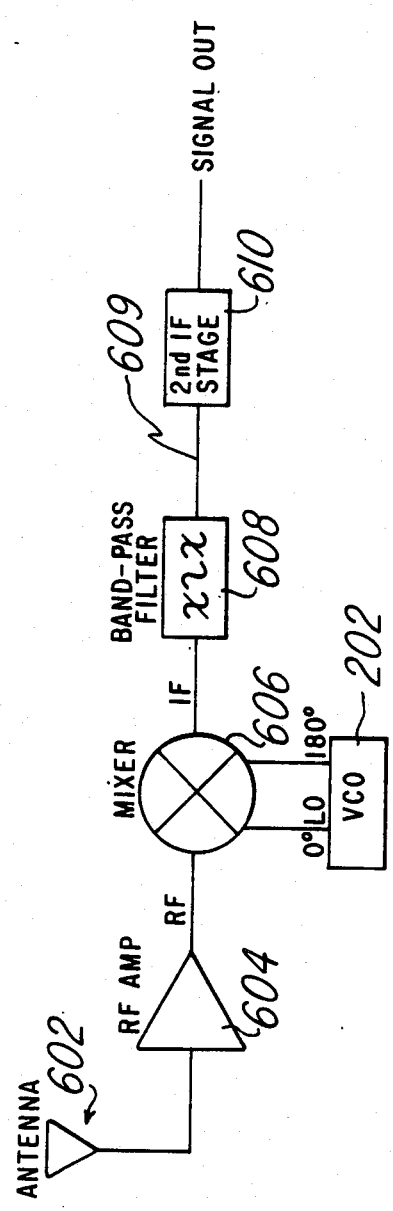
FIG. 6 shows a microwave receiver according to the present invention.

In an integrated microwave receiver according to the present invention, as shown for example in FIG. 6, one or more rf amplifier stages 604 are optionally used to amplify the rf microwave signal received from antenna 602 before it is provided to the mixer 606. (Alternatively, a mirowave signal which has already been amplified off-chip may be used.) A local oscillator 202, such as that shown in FIG. 2, provides opposite phase signals to the mixer 606 (which may be singly or doubly balanced. A conventional band-pass filter network 608 is preferably used at the output of the mixer, to remove rf signal components from the IF signal 609. The output of the filter network can then be provided to one or more following IF stages 610, in a communications receiver, or can be connected to a direct detector in other applications.

Figure 5:
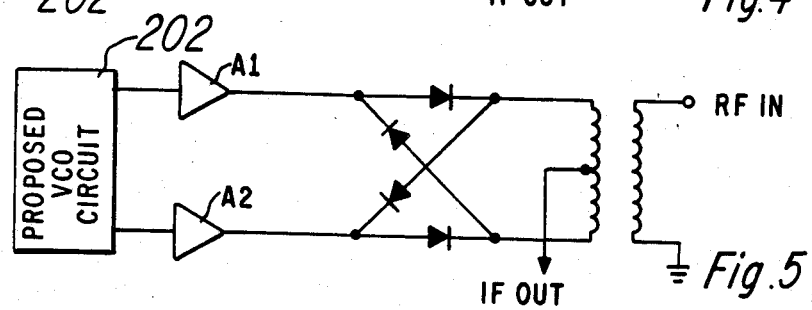
FIG. 5 shows a further embodiment of the present invention, wherein paired amplifiers are interposed between the push-push oscillator and the balance mixer.

A further advantage of the present invention is that amplifier stages A1 and A2 can be interposed between the local oscillator 202 and the mixer DR, as shown in FIG. 5. These stages A1 and A2 may be source-follower, common-source, or other configurations, as will easily be understood by microwave engineers. Since the frequency-dependence of the balun is not present, a broad-band amplifier can more easily be designed to fit the input impedance characteristics of the mixer and the output characteristics of the FETs.

Figure 3:
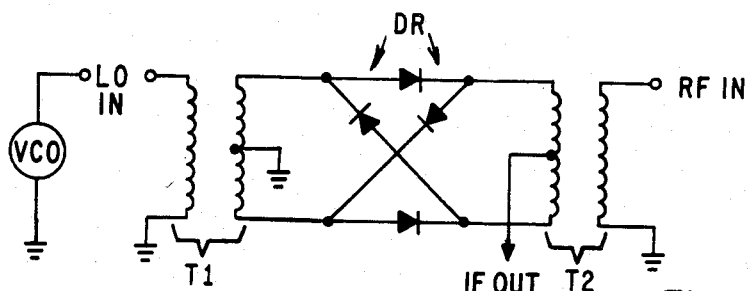
FIG. 3 shows a sample prior art oscillator-mixer combination.

FIG. 3 shows a sample double-balanced mixer configuration of the prior art. The output of a VCO provides the single-ended LO In signal, which is transformed by balun transformer T1 to provide a balanced input to diode ring DR. A second transformer T2 transforms the RF signal which is to be downconverted, to provide a second balanced input to diode ring DR. The output of the diode ring, shown as signal IF-out, can then be filtered and provided to subsequent stages (second IF, direct detector, or others as desired).

Figure 4:
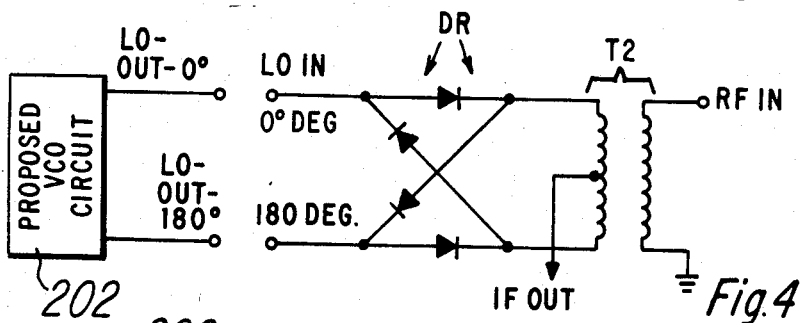
FIG. 4 shows a sample embodiment of the oscillator-mixer combination of the present invention.

FIG. 4 shows a sample double-balanced mixer according to the present invention. A diode ring DR is still used, but not no balun T1 is required. The VCO 202 is a push-push oscillator such as that shown in FIG. 2, and provides two outputs, LO-out-0 and LO-out-180, to the diode ring mixer DR. (Of course, as noted above, other mixer types may be used, and active device mixers will typically be more convenient for monolithic integration.) In this embodiment, a transformer balun T2 is preferably used to provide doubly-balanced mixing. Of course, the transformer T2 could be omitted, and the diode ring DR simply operated as a singly-balanced mixer, requiring no baluns, instead. The transformer T2 is preferably configured, in monolithic embodiments, as two coupled transmission lines, but is represented here in conventional notation as two coupled lumped inductors.

What is claimed is:
1. A microwave receiver comprising:
   a local oscillator comprising
      first and second field-effect transistors each comprising a gate and source and drain terminals, and
      a resonant circuit connected between the gates of said first and second field-effect transistors, said gates of said first and second field-effect transistors being located at opposite-phase points of said resonant circuit;
   a balanced mixer having an rf input and a mixed output and
      a first local-oscillator input operatively connected to one of said source and drain terminals of said first field-effect transistor
      and a second local-oscillator input operatively connected to one of said source and drain terminals of said second field-effect transistor;

means for providing an rf microwave signal to said balanced mixer; and means for filtering the output of said mixer to remove frequency components corresponding to said rf microwave signal therefrom.

2. The receiver of claim 1, wherein
said mixer is a doubly balanced mixer.

3. The receiver of claim 1, wherein
said mixer and said local oscillator are integrated in a common integrated circuit.

4. The receiver of claim 1, further comprising
a first amplification stage interposed between said first local-oscillator input and said one of said source and drain terminals of said first field-effect transistor
and a second amplification stage interposed between said second local-oscillator input and said one of said source and drain terminals of said second field-effect transistor.

5. The receiver of claim 1, further comprising
an rf amplification stage having an output connected to said rf input of said balanced mixer.

6. The receiver of claim 1, wherein
said mixer comprises a diode ring.

7. A microwave front end comprising
a local oscillator comprising
first and second field-effect transistors each comprising a gate and source and drain terminals, and
a resonant circuit connected between the gates of said first and second field-effect transistors, said gates of said first and second field-effect transistors being located at opposite-phase points of said resonant circuit;
a balanced mixer having an rf input and a mixed output and
a first local-oscillator input operatively connected to one of said source and drain terminals of said first field-effect transistor
and a second local-oscillator input operatively connected to one of said source and drain terminals of said second field-effect transistor.

8. The front end of claim 7, wherein
said mixer is a doubly balanced mixer.

9. The front end of claim 7, wherein
said mixer and said local oscillator are integrated in a common integrated circuit.

10. The front end of claim 7, further comprising
a first amplification stage interposed between said first local-oscillator input and said one of said source and drain terminals of said first field-effect transistor
and a second amplification stage interposed between said second local-oscillator input and said one of said source and drain terminals of said second field-effect transistor.

11. The front end of claim 7, wherein
said mixer comprises a diode ring.

12. The front end of claim 7, wherein said local oscillator further comprises means for providing a power supply voltage to each of said transistors.

13. The front end of claim 7, wherein each of said field-effect transistors is a Schottky-barrier-gate field effect transistor.

* * * * *